United States Patent
Jeong

(10) Patent No.: US 6,353,555 B1
(45) Date of Patent: Mar. 5, 2002

(54) FLASH MEMORY DEVICE CAPABLE OF MINIMIZING A SUBSTRATE VOLTAGE BOUNCING AND A PROGRAM METHOD THEREOF

(75) Inventor: Jae-Yong Jeong, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/597,174

(22) Filed: Jun. 20, 2000

(30) Foreign Application Priority Data

Jun. 22, 1999 (KR) .......................................... 99-23427

(51) Int. Cl.$^7$ ............................................. G11C 11/34
(52) U.S. Cl. ............................... 365/185.11; 365/185.29
(58) Field of Search ....................... 365/185.29, 185.11, 365/185.21

(56) References Cited

U.S. PATENT DOCUMENTS 5,909,398 A * 6/1999 Tanzawa et al. ....... 365/185.29

FOREIGN PATENT DOCUMENTS

JP          0142789    *  6/1991  ........... G11C/16/06

OTHER PUBLICATIONS

Betty Prince, "Semiconductor Memories", 1983, 2 nd Edition, pp. 620–623.*

* cited by examiner

Primary Examiner—David Nelms
Assistant Examiner—M. Tran
(74) Attorney, Agent, or Firm—Marger Johnson & McCollom, P.C.

(57) ABSTRACT

Disclosed is a nonvolatile semiconductor memory device which comprises a controller for controlling block select signal generators. The controller simultaneously activates the block select signal generators in a bit line setup and a recovery period, so that the word lines in each of memory blocks are set to a predetermined voltage (for example, a ground voltage, a power supply voltage, or an intermediate voltage), respectively. According to the control scheme, by attenuating a bouncing of a substrate voltage caused in an instant by means of a capacitive coupling between a bit line and a substrate at a transition of a bit line voltage, there are prevented an under program and a program disturb during a program cycle.

12 Claims, 6 Drawing Sheets

FLASH MEMORY DEVICE CAPABLE OF MINIMIZING A SUBSTRATE VOLTAGE BOUNCING AND A PROGRAM METHOD THEREOF

FIELD OF THE INVENTION

The present invention relates to integrated circuit devices. More particularly it concerns a NAND-type flash memory device made less susceptible to program disturb or under-programming by reducing substrate voltage bounce, and a method of programming such an improved device.

BACKGROUND OF THE INVENTION

FIG. 1 is a block diagram of a conventional NAND-type flash memory device. The conventional flash memory device comprises an array divided into a plurality of memory blocks BLK1 through BLKi. In the flash memory device, a plurality of bit lines BL1 through BLj are arranged to extend in parallel through the memory blocks BLK1 through BLKi. In each memory block BLK1 through BLKi, a plurality of strings are provided which correspond to the bit lines BL1 through BLj, respectively. Each of the strings in the respective memory blocks BLK1 through BLKi comprises a first string select transistor ST1, a second string select transistor ST2, and a plurality of, for example, sixteen flash EEPROM cell transistors M1 through M16 connected in series between a source of the first string select transistor ST1 and a drain of the second string select transistor ST2. A drain of the first string select transistor ST1 in each string is connected to a corresponding bit line, and a source of the second string select transistor ST2 therein is coupled to a common source line (a common signal line) CSL.

Gates of the first string select transistors ST1 in the strings are coupled in common to a first string select line SSL1, and gates of the second string select transistors ST2 therein are coupled in common to a second string select line SSL2. Control gates of the flash EEPROM cell transistors in each string are coupled in common to a corresponding one of the word lines WL1 through WL16. Each of the bit lines BL1 through BLj is electrically coupled to a page buffer circuit 10. As is well known to ones skilled in the art, the page buffer circuit 10 includes a plurality of page buffers (not shown) corresponding to the bit lines BL1 through BLj, respectively, each page buffer having a latch (not shown).

Referring still to FIG. 1, the conventional NAND-type flash memory device further comprises a plurality of block select control circuits 20_1 through 20_i, which are arranged so as to correspond to the memory blocks BLK1 through BLKi, respectively. Each of the block select control circuit 20_1 through 20_i is composed of a block select signal generator 22 (serving as a block select decoder) for generating a block select signal such as BSEL1 in response to a block select address, and a plurality of select transistors BT1 through BT18 connected as illustrated in FIG. 1. The transistors BT1 through BT18 (referred to herein as a switch portion) are simultaneously turned on/off in response to the block select signal, e.g. BSEL1. A plurality of drive lines SS1, CG1 through CG16, and SS2 coupled to a drive circuit 30 (serving as a word line decoder) are arranged in parallel via the block select control circuits 20_1 through 20_i. In other words, the drive lines SS1, CG1 through CG16, and SS2 are shared by the block select control circuits 20_1 through 20_i.

To select a memory block BLK1 which has the EEPROM cell transistors for programming, a block select signal BSEL1 corresponding to the selected memory block BLK1 is activated high. This causes the select transistors BT1 through BT18 of the block select control circuit 20_1 (corresponding to the selected memory block BLK1) to be turned on at the same time. On the other hand, block select signals BSEL1 through BSELi corresponding to de-selected memory blocks BLK2 through BLKi are deactivated, turning off the select transistors BT1 through BT18 of the block select control circuits 20_2 through 20_i. As a result, the first string select line SSL1, the word lines WL1 through WL16 and the second string select line SSL2 of the selected memory block BLK1 are electrically coupled to the corresponding drive lines SS1, CG1 through CG16 and SS2, whereas the lines SSL1, WL1–WL16 and SSL2 of each of the de-selected memory blocks BLK2 through BLKi are in a float or high-impedance state.

FIG. 2 is a timing diagram that illustrates a program operation of a conventional NAND-type flash memory device. The program operation of the conventional NAND-type flash memory device will be more fully described below with reference to the accompanying drawings.

As illustrated in FIG. 2, the program cycle is divided into a bit line setup period, a program period, a recovery (or discharge) period, and a verify period. Before the bit line setup period, all of the latches of the page buffer circuit 10 are first serially loaded with program data: "0" for cells to be programmed and "1" for cells to be program-inhibited. If a memory block BLK1 is selected, a block select signal BSEL1 is activated by the block select signal generator 20_1, so that the first string select line SSL1, the word lines WL1 through WL16 and the second string select line SSL2 of the selected memory block BLK1 are electrically coupled to the corresponding drive lines SS1, CG1 through CG16 and SS2 via the corresponding select transistors BT1 through BT18.

The bit lines BL1 through BLj are charged at a power supply voltage VCC or at a ground voltage VSS, depending on the program data thus loaded during the bit line setup period. For example, a bit line coupled to an EEPROM cell transistor to be programmed is charged at the ground voltage VSS, and a bit line coupled to an EEPROM cell transistor to be program-inhibited is charged at the power supply voltage VCC. The first string select line SSL1 of the selected memory block BLK1 is coupled to the corresponding drive line SS1 so as to be charged with the power supply voltage VCC, and the second string select line SSL2 thereof is coupled to the corresponding drive line SS2 so as to be charged at the ground voltage. The word lines WL1 through WL16 of the selected memory block BLK1 are maintained at the ground voltage VSS level, and the word lines WL1 through WL16 (labeled WLs in FIG. 2) of the deselected memory blocks BLK2 through BLK1 are maintained in a float state, as illustrated in FIG. 2.

During the program period, a selected word line WL1 of the selected memory block BLK1 is set to the program voltage $V_{pgm}$ (e.g. 15.5V–20V) via the drive line CG1 and the select transistor BT2 and each of the de-selected word lines WL2 through WL16 therein is set to the pass voltage $V_{pass}$ (e.g. 10V) via a corresponding drive line and select transistor. This produces a bias condition sufficient to cause Fowler-Nordheim tunneling of hot electrons from the drain side into a floating gate of an EEPROM cell transistor and EEPROM cell transistors coupled to the bit lines charged with the ground voltage VSS thus are programmed.

On the other hand, an EEPROM cell transistor which is coupled to the bit line charged with the power supply voltage VCC is program-inhibited. In particular, since the bit line and the gate of the first string select transistor ST1 are set to the power supply voltage VCC, a source of the first string select transistor ST1 is driven to a potential of approximately VCC-Vth, where Vth is the threshold voltage of the transistor ST1. However, once the source of the first string select transistor ST1 reaches a potential of about VCC-Vth, the first string select transistor ST1 is turned off (shut off). When this occurs, the source, drain and channel regions of the EEPROM cell transistors M1 through M16 become electrically disconnected from the bit line charged with the power supply voltage VCC and enter a floating state. Moreover, because the source, drain and channel regions of the EEPROM cell transistors M1 through M16 are capacitively coupled to their respective control gates WL1 through WL16, the application of respective pass and program voltages $V_{pass}$ and Vpgm to the control gates will cause the potentials of the source, drain and channel regions to be increased or boosted. This boosting effect prevents the full gate potential of $V_{pgm}$ or $V_{pass}$ from being established between the control gate and channel region of the EEPROM cell transistors M1 through M16. The boosting thereby inhibits the likelihood of inadvertent programming caused by Fowler-Nordheim tunneling of "hot" electrons into the floating gates of the EEPROM cell transistors M1 through M16.

A detailed description related to the program inhibit operation is disclosed in U.S. Pat. No. 5,677,873, entitled "METHOD OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN, which is hereby incorporated by reference.

Before the step for determining whether the EEPROM cell transistor has a required target threshold voltage is performed, voltages on the word lines WL1 through WL16 of the selected memory block BLK1 and the bit lines BL1 through BLj are discharged up to the ground voltage VSS level during the recovery period. Such a discharge operation is performed in order to prevent unnecessary program during the verify period. When a threshold voltage of the EEPROM cell transistor reaches a required target threshold voltage, a page buffer latch corresponding thereto is set to the power supply voltage VCC at the verify period. On the other hand, when a threshold voltage of the EEPROM cell transistor is less than the required target threshold voltage, a page buffer latch corresponding thereto continues to be set to the ground voltage VSS. The above described program cycle (setup/program/recovery/verify) is then repeated until all of the page buffer latches are set to the power supply voltage VCC during the verify period. The program voltage Vpgm is sequentially increased from 15.5V to 20V during the repeated program cycles, which is referred to as an incremental step pulse programming (ISPP) scheme.

As the program cycle is repeated, a threshold voltage of the EEPROM cell transistor to be programmed will be distributed between about 0.7V through 1.3V as illustrated in FIG. 3. According to the conventional NAND-type flash memory device, however, the threshold voltage of the programmed EEPROM cell transistor is distributed at a lower domain or at a higher domain than the target threshold voltage. The former is called an under-program or under-programming condition, and the latter is called a program-disturb condition. A major cause of the under program and the program disturb is that the substrate voltage $V_B$ bounces, as will be more fully described below with reference to the accompanying drawings.

When the bit line coupled to an EEPROM cell transistor to be program-inhibited is charged with the power supply voltage VCC, i.e. at an initial stage of the bit line setup period, the substrate voltage $V_B$ of the ground voltage VSS is in an instant increased by a voltage $V_{up1}$ as illustrated in FIG. 4 which is a diagram showing change of a substrate voltage $V_B$ at a program cycle. This is because the bit line BL is capacitively coupled to the p-type substrate (pocket P-well) illustrated in FIG. 5 which is a cross-sectional view taken along a bit line direction. The voltage $V_{up1}$ is determined by a coupling ratio of a total capacitance $C_A$ between the bit line BL and the p-type substrate to a substrate capacitance $C_B$ (that is, a junction capacitance between the pocket p-well and an n-well (not shown) surrounding the pocket p-well). The voltage $V_{up1}$ (or $V_{UP1}$) is expressed as follows.

$$V_{UP1} = \frac{C_A}{C_A + C_B} \times \Delta V_{BL}$$

In the equation, the total capacitance $C_A$ between the bit line and the p-type substrate is $(C_{A1}+C_{A2}+C_{A3})$. The capacitance $C_{A1}$ indicates a junction capacitance between the p-type substrate and an n+ region to which the bit line BL is connected; the capacitance $C_{A2}$ indicates a direct capacitance between the bit line BL and the p-type substrate; and the capacitance $C_{A3}$ indicates a capacitance gained by summing a capacitance $C_{A21}$ between the bit line BL and a word line WL (or a control gate of an EEPROM cell transistor) and a capacitance $C_{A22}$ between the word line WL and the p-type substrate. It will be appreciated that the capacitance $C_{A1}$ exists at all memory blocks BLK1 through BLKi, and that the capacitance $C_{A2}$ does not exist at a selected memory block because the string select lines SSL1 and SSL2 and the word lines WL1 through WL16 are at a fixed voltage level (for example, VCC, Vpass, Vpgm and VSS). However, the capacitance $C_{A2}$ exists at de-selected memory blocks because the string select lines SSL1 and SSL2 and the word lines WL1 through WL16 continue to be at a floating state during the program period.

FIG. 6 shows a part of a cross section taken along a word line direction. A word line WL behaves as a gate electrode of the parasitic field transistor, a field oxide SiO2 beneath the word line WL acts as a gate oxide, and n+ regions (diffused regions) serve as a source and a drain of the parasitic field transistor. A channel region of such parasitic transistor exists between the source and the drain, as shown in FIG. 6. If a voltage exceeding the threshold voltage of the parasitic transistor is applied to the word line WL, inversion of the parasitic channel region occurs, establishing a leakage current path between adjacent n+ regions. Consequently, to avoid the loss of isolation among neighboring n+ regions, the threshold voltage $V_{TF}$ of such parasitic field transistor must be greater than any possible operating voltage.

As is well known as those skilled in the art, as the substrate voltage $V_B$ is changed, a threshold voltage Vth of a metal-oxide-semiconductor field effect transistor (MOSFET) changes in proportion to the substrate voltage $V_B$ change. This is due to a body effect (or a substrate bias effect), which is expressed as $Vth=V_{FB}+2\Phi_f+\gamma\sqrt{2\Phi_{f+V_{SB}}}$. Since the substrate voltage $V_B$ increased by the voltage $V_{up1}$ is at a voltage $V_{up2}$ at an initial stage of the program period, that is, $V_{SB}=-V_{up2}$, the threshold voltage $V_{TF}$ of the parasitic field transistor decreases in proportion to the change of the substrate voltage $V_B$.

In the case where the threshold voltage $V_{TF}$ of the parasitic field transistor is lower than the program voltage Vpgm (for example, 15.5V–20V) on the word line WL, inversion of the channel region of the parasitic field transistor occurs. This causes charges collected (boosted) in the channel region of the program-inhibited EEPROM cell transistor to leak via the channel of the parasitic field transistor. Therefore, an efficiency of the channel boosting scheme for preventing an EEPROM cell transistor from being programmed is reduced, so that the EEPROM cell transistor to be program inhibited is soft programmed. Accordingly, a threshold voltage of an EEPROM cell transistor is shifted toward a higher domain than the target threshold voltage distribution as illustrated in FIG. 3. An undesirable the program disturb condition results.

When the voltages on the respective bit lines BL1 through BLj are discharged at an initial stage of the recovery period, the substrate voltage $V_B$ is in an instant decreased by a voltage $V_{down1}$ due to the above described capacitive coupling. As illustrated in FIG. 4, since the substrate voltage $V_B$ is at a voltage $V_{down2}$ lower than the ground voltage VSS at an initial stage of the verify period, the threshold voltage of an EEPROM cell transistor to be programmed increases apparently due to the body effect. Although it isn't sufficiently programmed, the EEPROM cell transistor to be programmed is discriminated as an off state during the verify period. Accordingly, the threshold voltage of an EEPROM cell transistor to be programmed is shifted toward a lower domain than the target threshold voltage distribution, as illustrated in FIG. 3. An undesirable under-program condition results.

SUMMARY OF THE INVENTION

It is therefore an object of the present invention to provide a NAND-type flash memory device capable of preventing an under program and a program disturb by minimizing substrate voltage bounce. An attendant object is to produce a program method for such an improved flash memory device.

In order to attain above objects, according to an aspect of the present invention, there is provided a nonvolatile semiconductor memory device which comprises a plurality of memory blocks. Each of the memory blocks includes a plurality of memory cells arranged in a matrix format of rows and columns; a plurality of block select control circuits each corresponding to the memory blocks. Each of the block select control circuits couples the rows of a corresponding memory block with corresponding drive lines during a program cycle; and a controller for controlling the block select control circuits such that the rows of each of the memory blocks are coupled with the corresponding drive lines during a bit line setup and a recovery period of the program cycle, wherein the rows of each memory block are set to a predetermined voltage in the bit line setup and the recovery period of the program cycle.

In the memory device according to the present invention, each of the block select control circuits comprises a block select signal generator which produces a block select signal for selecting a corresponding memory block during the program cycle; and a switch portion which couples the rows of the corresponding memory block with the corresponding drive lines in response to the block select signal.

Furthermore, in the memory device according to the present invention, the controller causes the rows of each of the memory blocks to be coupled with the corresponding drive lines during a recovery period of the program cycle so as to be set to the predetermined voltage.

Still further, in the memory device according to the present invention, the predetermined voltage is one selected from a ground voltage, a power supply voltage, and an intermediate voltage between the ground and power supply voltages.

According to another aspect of this invention, there is provided a program method for use with a nonvolatile semiconductor memory device which comprises a plurality of bit lines; a plurality of memory blocks each including a plurality of word lines and a plurality of memory cells arranged in a matrix format of the bit lines and the word lines; and a plurality of block select control circuits each corresponding to the memory blocks, and each coupling the word lines of a corresponding memory block with corresponding drive lines during a program cycle. The program method comprises the steps of loading the bit lines with data to be programmed; programming the data in a selected memory block; and discharging voltages on the bit lines, wherein the word lines of each of the memory blocks are coupled with corresponding drive lines so as to be set to a predetermined voltage in the loading and the discharging step.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

A preferred embodiment of the present invention will be more fully described below with reference to the accompanying drawings.

Figure 7:
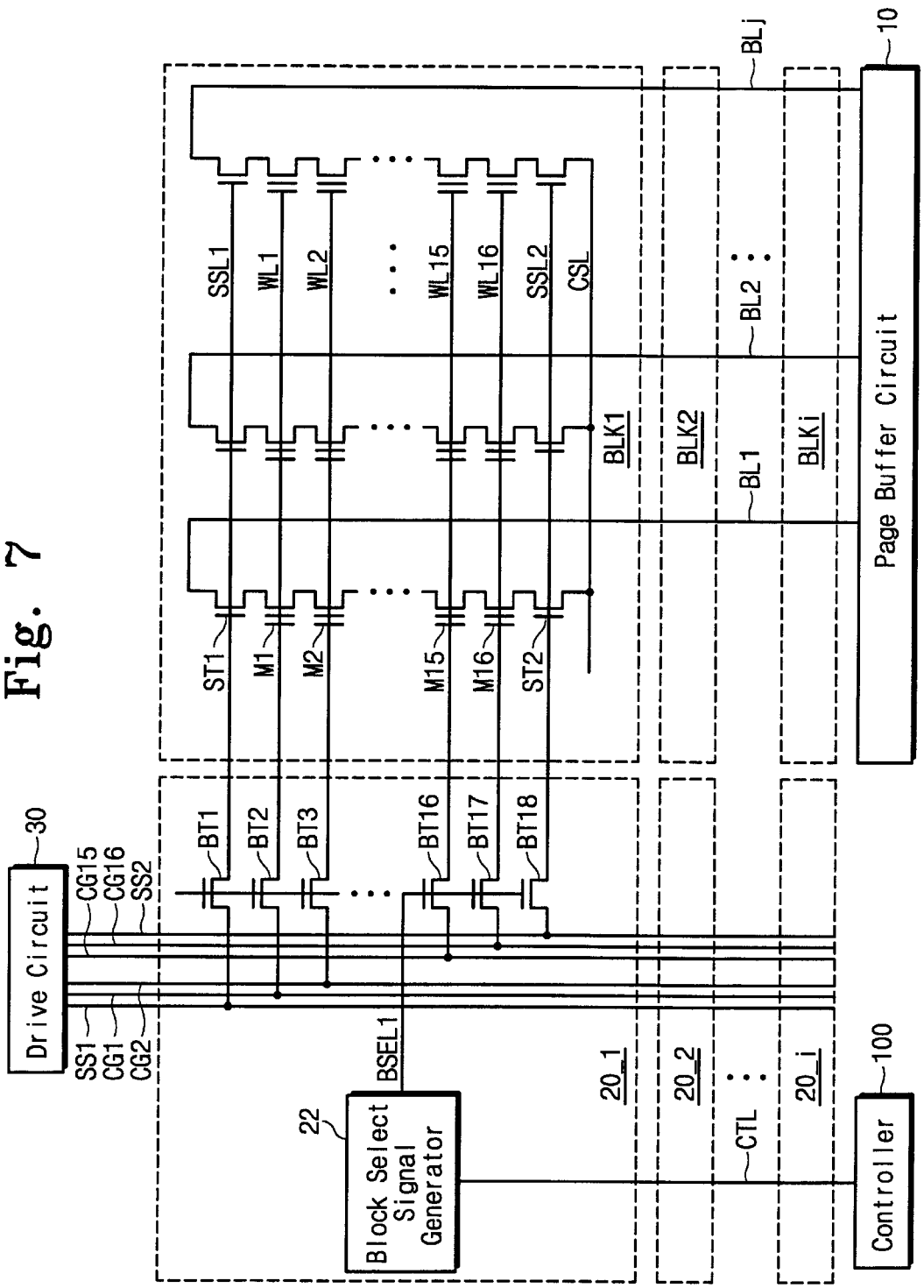
FIG. 7 is diagram showing a NAND-type flash memory device according to the present invention.

FIG. 7 is a diagram showing a NAND-type flash memory device according to the present invention. In FIG. 7, the constituent elements that are identical to those in FIG. 1 are labeled with the same reference numerals, and description thereof is thus omitted.

Figure 1:
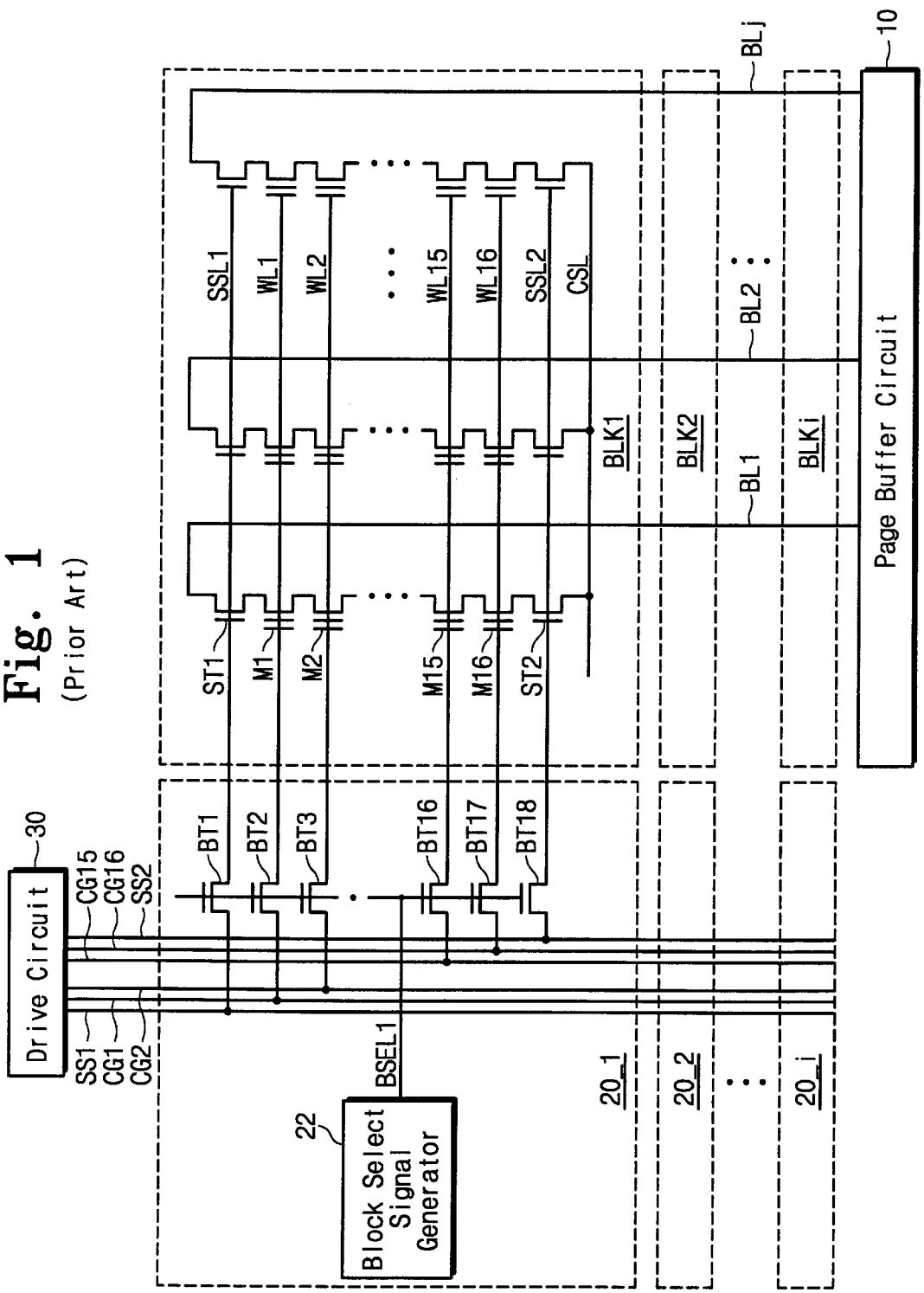
FIG. 1 is a diagram showing a conventional NAND-type flash memory device.
Figure 2:
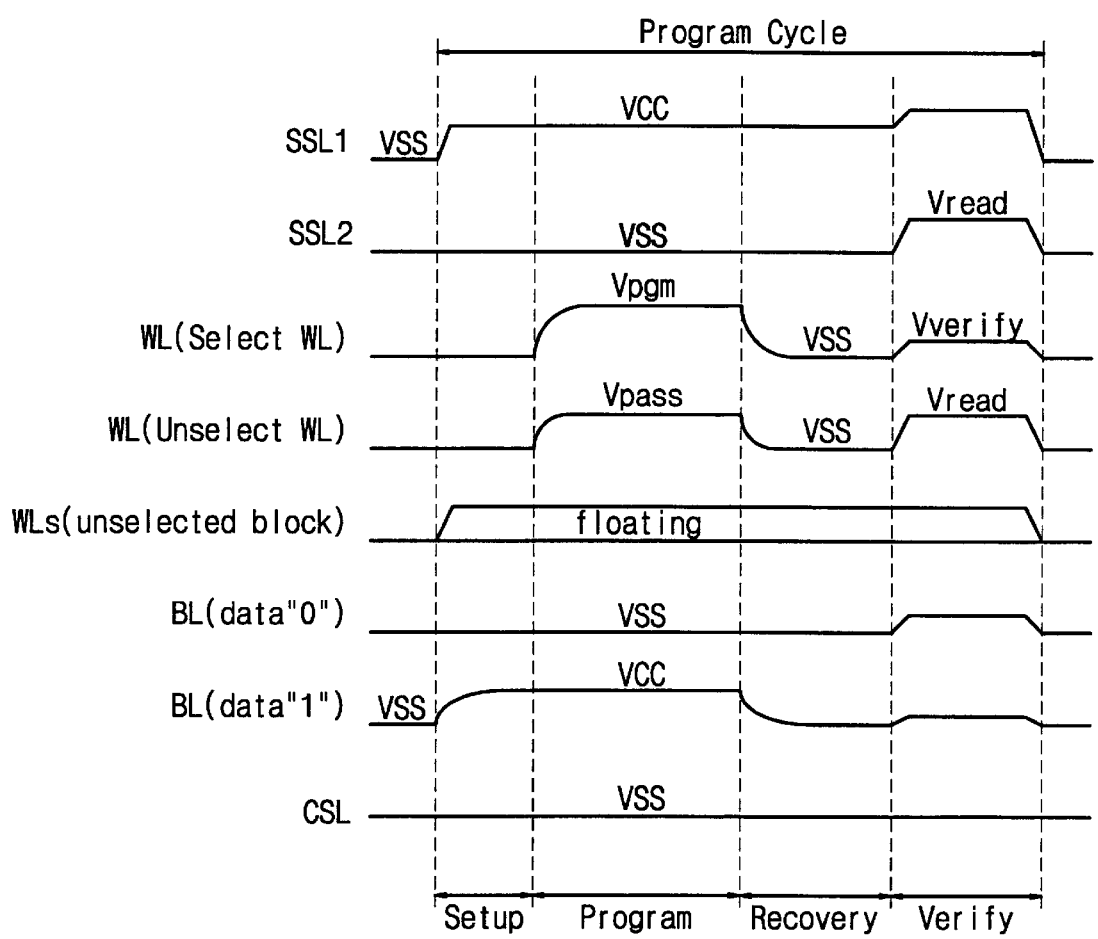
FIG. 2 is a timing diagram illustrating a program operation of a conventional NAND-type flash memory device.

The NAND-type flash memory device of FIG. 7 differs from that of FIG. 1 importantly in that a circuit 100 for controlling the block select signal generators 22 of the block select control circuits 20_1 through 20_i is provided. The circuit 100 for controlling the generators 22 (hereinafter, referred to as a controller) generates a control signal CTL for substantially simultaneously (concurrently) activating all of the block select signal generators 22 during the bit line setup and the recovery period. This causes the block select signals BSEL1 through BSELi to be activated concurrently, so that the first string select line SSL1, the word lines WL1 through WL16 and the second string select line SSL2 in the respective memory blocks BLK1 through BLKi are electrically coupled via the corresponding select transistors BT1 through BT18 to the corresponding drive lines SS1, CG1 through CG16 and SS2. During the bit line setup and the recovery period, the drive line SSL2s set to the power supply voltage VCC and the drive lines CG1 through CG16 and SS2 are set to the ground voltage VSS. Therefore, all of the word lines WL1 through WL16 in the de-selected memory blocks are set to the ground voltage VSS instead of a floating state during the bit line and the recovery period.

Figure 8:
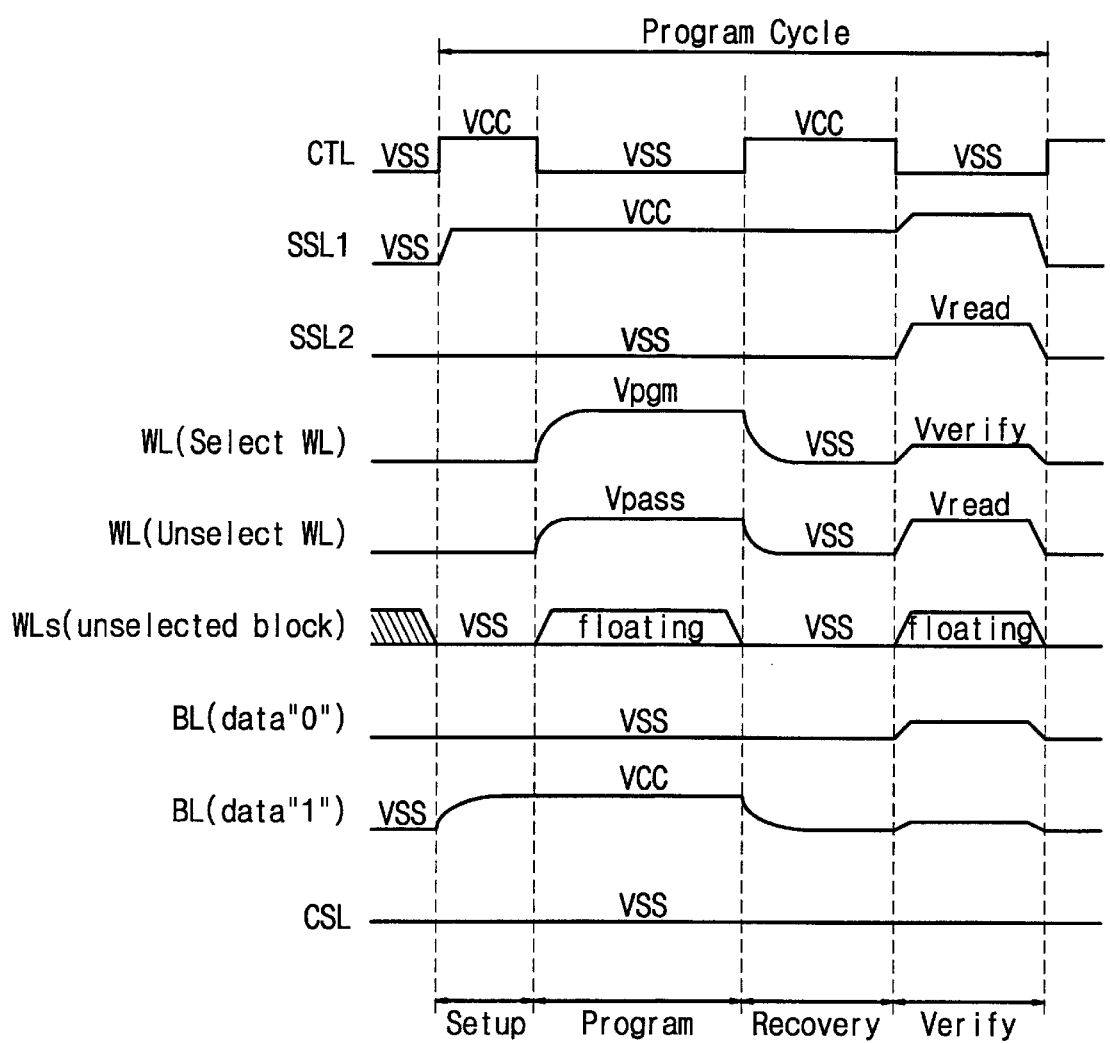
FIG. 8 is a timing diagram illustrating a program operation according to the present invention.

FIG. 8 is a timing diagram for describing a program operation in accordance with the present invention. The program operation of the present invention will be more fully described below with reference to the accompanying drawings.

A program cycle is divided into a bit line setup period, a program period, a recovery (or discharge) period, and a verify period. Before the bit line setup period, all of the latches of the page buffer circuit 10 are first serially loaded with program data: "0" for cells to be programmed and "1" for cells to be program-inhibited.

As illustrated in FIG. 8, the control signal CTL from the controller 100 transitions from a logic low level to a logic high level in the bit line setup period. This activates (high) the block select signals BSEL1 through BSELi respectively corresponding to the memory blocks BLK1 through BLKi, so that the select transistors BT1 through BT18 of the respective block select control circuits 20_1 through 20_i are simultaneously turned on. As a result, the first string select line SSL1 of the respective memory blocks BLK1 through BLKi is coupled to the corresponding drive line SS1 so as to be charged with the power supply voltage VCC from the drive circuit 30, the second string select line SSL2 thereof is coupled to the corresponding drive line SS2 so as to be charged with the ground voltage VSS from the drive circuit 30, and the word lines WL1 through WL16 thereof are coupled to the corresponding drive lines CG1 through CG16 so as to be charged with the ground voltage VSS. Under the above described condition, at the bit line setup period, the bit lines BL1 through BLj are charged at a power supply voltage VCC or at a ground voltage VSS, depending on the program data thus loaded in the page buffer circuit 10.

Before entering the program period, as illustrated in FIG. 8, the control signal CTL transitions from a logic high level (VCC) to a logic low level (VSS). After this, a selected word line of a selected memory block is set to the program voltage Vpgm from the drive circuit 30 and deselected word lines thereof are set to the pass voltage Vpass from the drive circuit 30. On the other hand, all of the word lines WL1 through WL16 of the deselected memory blocks are set to a floating state because the select transistors BT1 through BT18 corresponding to the de-selected memory blocks are turned off in accordance with the high-to-low transition of the control signal CTL. In the program period, the EEPROM cell transistors coupled to the selected word line are programmed or program inhibited in the same manner as the conventional NAND-type flash memory device.

Before it is determined whether an EEPROM cell transistor to be programmed has a required target threshold voltage, the voltages on the word lines WL1 through WL16 of the selected memory block and on the bit lines BL1 through BLj are discharged up to the ground voltage VSS level during the recovery period.

The control signal CTL transitions from a logic low level to a logic high level at the beginning of the recovery period, so that the block select signals BSEL1 through BSELi respectively corresponding to the memory blocks BLK1 through BLKi are activated (high). This causes the select transistors BT1 through BT18 of the block select control circuits 20_1 through 20_i to be turned on. As a result, the first string select line SSL1, of the respective memory blocks BLK1 through BLKi, is coupled to the corresponding drive line SS1 so as to be charged with the power supply voltage VCC, the second string select line SSL2 thereof is coupled to the corresponding drive line SS2 so as to be charged at the ground voltage, and the word lines WL1 through WL16 thereof are coupled to the corresponding drive lines CG1 through CG16 so as to be charged with the ground voltage VSS.

Continuously, before entering the verify period, as illustrated in FIG. 8, the control signal CTL transitions from a logic high level (VCC) to a logic low level (VSS). After this, the selected word line of the selected memory block is set to a verify voltage $V_{verify}$ (e.g. 0.7V) from the drive circuit 30 and de-selected word lines thereof are set to the read voltage $V_{read}$ (e.g. 4.5V) from the drive circuit 30. On the other hand, all of the word lines WL1 through WL16 of de-selected memory blocks are set to a floating state because the select transistors BT1 through BT18 corresponding to the de-selected memory blocks are turned off by the high-to-low transition of the control signal CTL. During the verify period, and in the same manner as with the conventional NAND-type flash memory device, it is determined whether the EEPROM cell transistor reaches the required target threshold voltage. The above described program cycle is then repeated until all of the page buffer latches are set to the power supply voltage in the verify period.

In this embodiment, the program voltage Vpgm is sequentially increased from 15.5V to 20V during the repeated program cycles in accordance with the above-described ISPP scheme. During the bit line setup and the recovery period, it will be appreciated by ones skilled in the art that the word lines WL1 through WL16 of the memory blocks BLK1 through BLKi are capable of being charged with the power supply voltage VCC and an intermediate voltage instead of the ground voltage VSS.

According to the NAND-type flash memory device of the present invention as described above, by setting the lines SSL2 and WL1 through WL16 of the deselected memory blocks to the ground voltage VSS and the line SSL1 thereof to the power supply voltage VCC in the bit line setup and the recovery period, the capacitance $C_{A2}$ is perfectly eliminated by means of a shielding effect of the word lines WL1 through WL16 of the deselected memory blocks, and the capacitance $C_{A3}$ is also reduced sufficiently to have no undesirable effect, by means of the shielding effect of the word lines WL1 through WL16. Furthermore, the substrate capacitance $C_B$ is increased because the capacitance $C_{A22}$ effectively adds to the substrate capacitance $C_B$.

Figure 3:
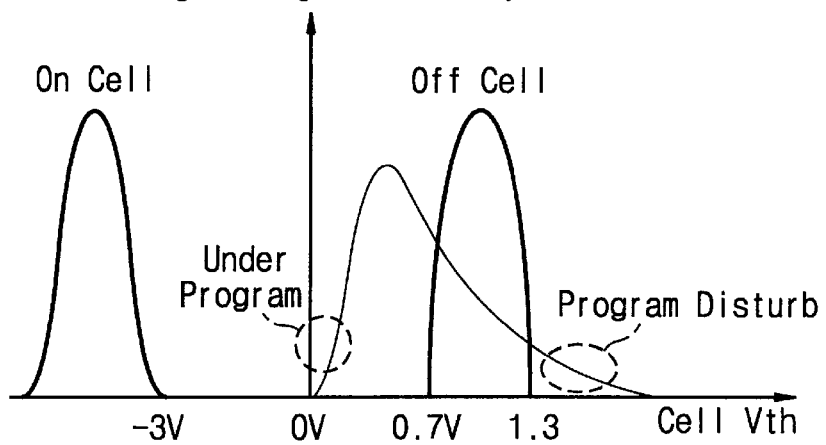
FIG. 3 is a diagram showing conventional threshold voltage probability distribution of on cells and off cells.
Figure 4:
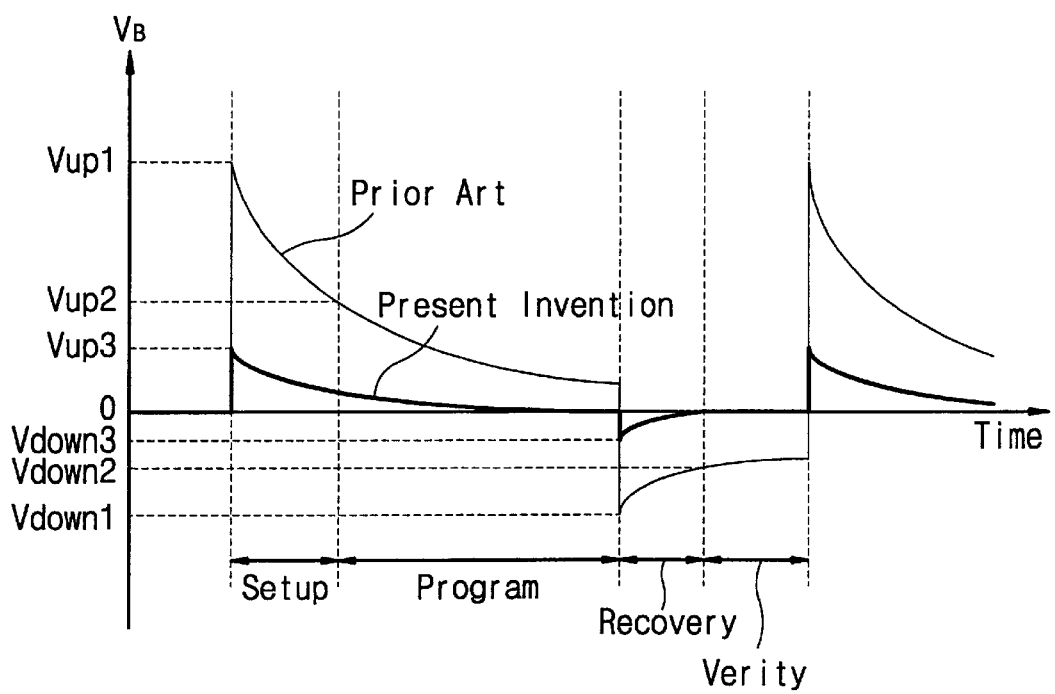
FIG. 4 is a diagram showing a change of a substrate voltage during a program cycle.
Figure 5:
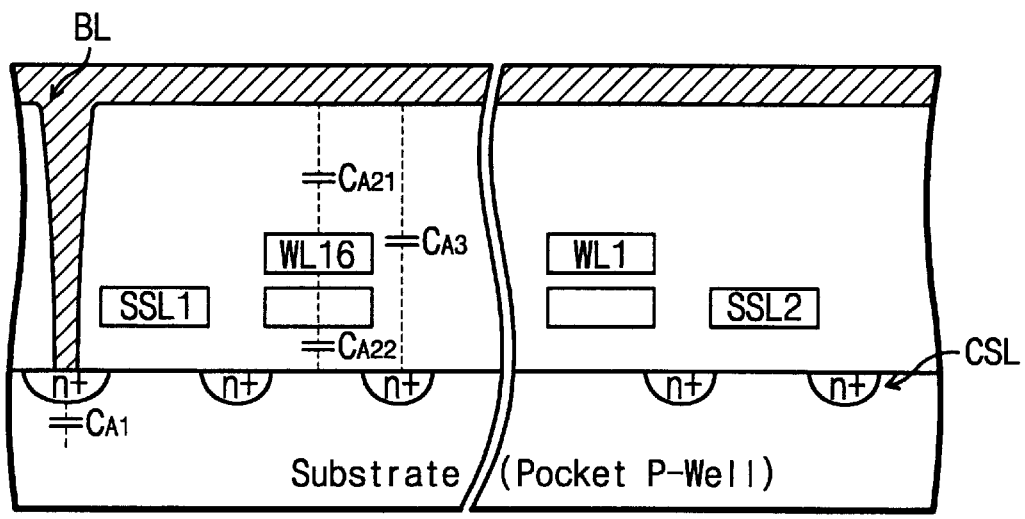
FIG. 5 is a cross-sectional diagram taken along a bit line direction in FIG. 1.
Figure 6:
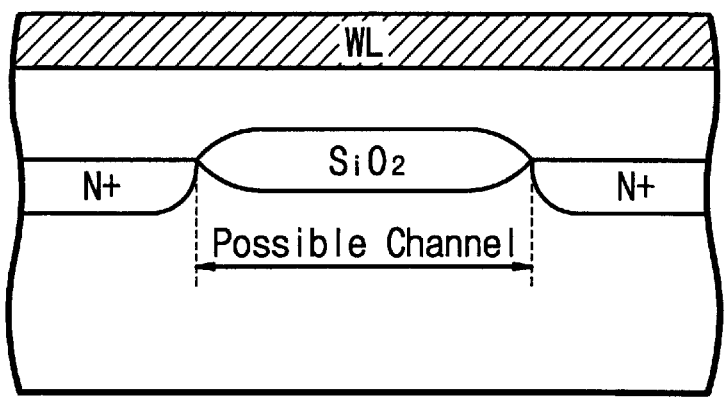
FIG. 6 is a cross-sectional diagram taken along a word line direction in FIG. 1.

As a result, since the total capacitance $C_A$ is reduced and the substrate capacitance $C_B$ is increased, the voltage $V_{UP1}$, which is relatively high due to the capacitive coupling between the bit line and the substrate, is reduced to a voltage $V_{UP3}$ illustrated in FIG. 4. Therefore, the threshold voltage $V_{TF}$ of the parasitic field transistor as illustrated in FIG. 6 is prevented from becoming less than the word line voltage, thereby preventing the program disturb condition. Similarly, the absolute value of the negative voltage $V_{down1}$, which is relatively low due to the caparition coupling between the bit line and the substrate, is reduced to a voltage $V_{down3}$ as illustrated in FIG. 3. Therefore, the conventional tendency for the threshold voltage of an EEPROM cell transistor not to be programmed sufficiently is overcome, thereby preventing the under-program condition.

The invention has been described using an exemplary preferred embodiment. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A nonvolatile semiconductor flash memory device comprising:

a plurality of memory blocks, wherein each of the memory blocks includes a plurality of memory cells arranged in a matrix format of rows and columns;

a plurality of block select control circuits corresponding to the plurality of memory blocks, wherein each of the block select control circuits couples the rows of a corresponding memory block with corresponding drive lines during a program cycle and wherein each of the block select control circuits comprises a block select signal generator which produces a block select signal for selecting a corresponding memory block during the program cycle and a switch portion which couples the rows of the corresponding memory block with the corresponding drive lines in response to the block select signal; and a controller for controlling the plurality of block select control circuits such that the rows of each of the memory blocks are coupled with the corresponding drive lines during a bit line setup period of the program cycle, wherein the rows of each memory block are set to a predetermined voltage during the bit line setup period of the program cycle.

2. The memory device according to claim 1, wherein the controller causes the rows of each of the memory blocks to be coupled with the corresponding drive lines during a recovery period of the program cycle so as to be set to the predetermined voltage.

3. The memory device according to claim 2, wherein the predetermined voltage is one selected from a ground voltage, a power supply voltage, and an intermediate voltage between the ground and power supply voltages.

4. The memory device according to claim 3, wherein the controller inactivates block select signal generators of de-selected memory blocks during a program period and a verify period of the program cycle so that the rows of the de-selected memory blocks are at a floating state.

5. The memory device according to claim 1, wherein the memory device comprises a NAND-type flash memory device.

6. A nonvolatile semiconductor memory device comprising:

a plurality of memory blocks, wherein each of the memory blocks includes a plurality of memory cells arranged in a matrix format of rows and columns;

a plurality of block select control circuits corresponding to the plurality of memory blocks, wherein each of the block select control circuits comprises:

a block select signal generator which produces a block select signal for selecting a corresponding memory block during the program cycle;

a switch portion which couples the rows of the corresponding memory block with the corresponding drive lines in response to the block select signal; and a controller for substantially simultaneously activating the block select control circuits such that the rows of each of the memory blocks are coupled with the corresponding drive lines during a bit line setup and a recovery period of the program cycle, wherein the rows of each memory block are set to a predetermined voltage during the bit line setup and the recovery period of the program cycle.

7. The memory device according to claim 6, wherein the memory device comprises a NAND-type flash memory device.

8. The memory device according to claim 6, wherein the predetermined voltage is one selected from a ground voltage, a power supply voltage, and an intermediate voltage between the ground and power supply voltages.

9. A program method for use in a nonvolatile semiconductor memory device which comprises a plurality of bit lines; a plurality of memory blocks each including a plurality of word lines and a plurality of memory cells arranged in a matrix format of the bit lines and the word lines; and a plurality of block select control circuits corresponding to the plurality of memory blocks, each block select control circuit coupling the word lines of a corresponding memory block with corresponding drive lines during a program cycle, the program method comprising the steps of:

loading the bit lines with data to be programmed;

programming the data in a selected memory block; and discharging voltages on the bit lines, wherein the word line each of the memory blocks are coupled with corresponding drive lines so as to be set to a predetermined voltage during the loading and the discharging step.

10. The program method according to claim 9, further comprising the step of verifying whether the data is correctly programmed in the selected memory block.

11. The program method according to claim 9, wherein the memory device comprises a NAND-type flash memory device.

12. The program method according to claim 9, wherein the predetermined voltage is one selected from a ground voltage, a power supply voltage, and an intermediate voltage between the ground and power supply voltages.

* * * * *

UNITED STATES PATENT AND TRADEMARK OFFICE
CERTIFICATE OF CORRECTION

PATENT NO.    : 6,353,555 B1
DATED         : March 5, 2002
INVENTOR(S)   : Jeong It is certified that error appears in the above-identified patent and that said Letters Patent is hereby corrected as shown below:

Column 2,
Line 52, "BLK2 through BLKl" should read -- BLK2 through BLK1 --.

Column 4,
Line 54, "known as those" should read -- known to those --.

Column 7,
Line 3, "SSL2s" should read -- SSL1 --.

Signed and Sealed this

Fifteenth Day of October, 2002

Attest:

Attesting Officer

JAMES E. ROGAN
Director of the United States Patent and Trademark Office